(12) United States Patent
Mauder et al.

(10) Patent No.: US 7,635,909 B2
(45) Date of Patent: Dec. 22, 2009

(54) SEMICONDUCTOR DIODE AND IGBT

(75) Inventors: Anton Mauder, Kolbermoor (DE); Hans-Joachim Schulze, Ottobrunn (DE); Frank Pfirsch, München (DE); Elmar Falck, Ottobrunn (DE); Josef Lutz, Chemnitz (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/023,040

(22) Filed: Dec. 23, 2004

(65) Prior Publication Data

US 2005/0161746 A1 Jul. 28, 2005

(30) Foreign Application Priority Data

Dec. 23, 2003 (DE) .............................. 103 61 136

(51) Int. Cl.
*H01L 29/866* (2006.01)
*H01L 29/06* (2006.01)
(52) U.S. Cl. ................ 257/603; 257/154; 257/653; 257/657; 257/495; 257/E29.335
(58) Field of Classification Search ................. 257/495, 257/112, 603, 653, 656, 657, E29.335, 154
See application file for complete search history.

(56) References Cited

U.S. PATENT DOCUMENTS

| 4,134,123 | A | * | 1/1979 | Shannon ..................... 257/484 |
| 5,162,876 | A | * | 11/1992 | Kitagawa et al. ............ 257/138 |
| 6,239,466 | B1 | | 5/2001 | Elasser et al. |
| 6,465,863 | B1 | * | 10/2002 | Deboy et al. ................ 257/495 |
| 2001/0045567 | A1 | | 11/2001 | Auerbach et al. |

FOREIGN PATENT DOCUMENTS

| DE | 198 23 944 A1 | 12/1999 |
| DE | 198 43 659 A1 | 4/2000 |

OTHER PUBLICATIONS

Wolf and Tauber; Silicon Processing for the VLSI Era vol. 1—Process Technology 2nd Edition; 2000; Ion Implantation for ULSI; Chapter 10.1-10.3; pp. 371-398.*

* cited by examiner

*Primary Examiner*—David Vu
*Assistant Examiner*—Earl N Taylor
(74) *Attorney, Agent, or Firm*—Maginot Moore & Beck

(57) ABSTRACT

A semiconductor diode has an anode, a cathode and a semiconductor volume provided between anode and cathode. A plurality of semiconductor zones are formed in the semiconductor volume, which semiconductor zones are inversely doped with respect to their immediate surroundings, spaced apart from one another and provided in the vicinity of the cathode. The semiconductor zones are spaced apart from the cathode.

13 Claims, 4 Drawing Sheets

SEMICONDUCTOR DIODE AND IGBT

FIELD OF THE INVENTION

The invention relates to a semiconductor diode and also to an IGBT.

BACKGROUND

In the field of power semiconductor technology, it is endeavored to provide semiconductor devices with protection mechanisms in order that destruction of the semiconductor devices can be prevented even under extreme conditions.

Such extreme conditions may occur, inter alia, during the commutation of power semiconductor diodes: during the commutation process, high electric fields are present for example at the $n^-n$ junction of a $pn^-n$ semiconductor diode, which leads to an avalanchelike generation of charge carriers at the $n^-n$ junction. At the same point in time, high electric field strengths occur at the $pn^-$ junction of the $pn^-n$ semiconductor diode and lead to an avalanchelike generation of charge carriers at the pn junction. The abrupt, avalanchelike generation of charge carriers (so-called "avalanche effect") means that a high electric field required for the blocking capability of the semiconductor diode can no longer be maintained in the $n^-$-doped central region of the semiconductor diode. The semiconductor diode thus loses its blocking capability and is destroyed unless external measures for limiting current and power have been implemented.

In order to avoid destruction of the semiconductor diode, the commutation process of the diode has hitherto had to be effected sufficiently slowly. When using such semiconductor diodes within IGBT semiconductor modules, however, it has thus been necessary to accept an increase in the switch-on losses of the IGBT.

A further possibility for preventing the semiconductor diode from being destroyed consists in increasing the chip thickness of the semiconductor diode or reducing the quantity of flooding charge at the anode and simultaneously increasing the flooding charge at the cathode. However, such measures entail increased on-state or switching losses.

In the case of IGBT (Insulated Gate Bipolar Transistor) semiconductor devices (in particular in the case of field stop IGBTs and PT ("punch through") IGBTs), extreme conditions occur primarily when high currents are switched off and in the event of short circuits. When high currents are switched off, care must be taken to ensure that corresponding current decreases within the IGBT semiconductor device do not turn out to be excessively steep, which is the case particularly when, in the case of a required reverse voltage, no or too little flooding charge is present in the rear side part of the IGBT semiconductor device and the load current consequently undergoes chopping. In the event of short circuits, on account of the strong electron flow through the channel induced in the IGBT semiconductor device, the state may arise in which the highest electric field strength within the IGBT semiconductor device does not occur at the pn junctions near the front side, but rather at the rear side $nn^+$ junction toward the field stop layer or buffer layer. This may in turn have the effect that an avalanchelike generation of charge carriers is effected at the $nn^+$ junction and leads to the reduction of an electric field within the IGBT semiconductor device and thus to a loss of the blocking capability of the device. In both cases, the IGBT semiconductor device may be destroyed.

In the case of NPT ("non-punch through") IGBTs, the problems described above cannot occur, in principle, since a sufficiently thick neutral zone remains or no field stop layer is present in these semiconductor devices. Since the electric field within the NPT IGBT, on account of the increased thickness of the semiconductor device, practically never forms in the entire semiconductor volume, a sufficient quantity of charge carriers for current transport is always available during a current turn-off process, with the result that the load current cannot undergo chopping. In the event of short circuits, a higher electron current density leads to a shallower gradient of the electric field and thus to the space charge zone approaching the rear side emitter (for example p-doped), which, on account of this, injects more holes into the semiconductor device. This additional positive charge in turn leads to a steepening of the electric field and thus to the stabilization thereof. The blocking capability of the IGBT can thus be maintained.

What is disadvantageous about NPT IGBTs, however, is their increased chip thickness compared with field stop or PT IGBTs, which correspondingly increases switching and on-state losses. It has therefore been attempted to interrupt the field stop layer or configure it in insular fashion and/or to lightly dope it. This again has the disadvantage that it is necessary to find a compromise between the static blocking capability of the semiconductor device and the softness or short circuit strength. Although it is possible to improve the softness or short circuit strength of the semiconductor device by increasing the doping of the rear side emitter, this leads to a high degree of charge carrier flooding even under normal conditions, which is undesirable since this results in increased switching losses.

The object on which the invention is based is to specify a semiconductor diode and an IGBT which are configured as compactly as possible in their dimensions and at the same time preclude destruction of the semiconductor devices under extreme conditions.

SUMMARY

This object is achieved by a semiconductor diode in accordance embodiments of the invention. Furthermore, the invention provides an IGBT in accordance with other embodiments. Advantageous refinements and developments of the concept of the invention are found in various embodiments.

The semiconductor diode according to the invention has an anode, a cathode, and a semiconductor volume provided between anode and cathode. A plurality of semiconductor zones are formed in the semiconductor volume, which semiconductor zones are inversely doped with respect to their immediate surroundings, spaced apart from one another and provided in the vicinity of the cathode. In this case, the semiconductor zones are also spaced apart from the cathode, that is to say do not directly adjoin the latter.

In a first preferred embodiment, the semiconductor volume has a first, second and third semiconductor layer arranged in this order on the cathode. In this case, the first semiconductor layer is $n^+$-doped, the second semiconductor layer is $n^-$-doped and the third semiconductor layer is p-doped. In this embodiment, the semiconductor zones are formed as p-doped zones within the second semiconductor layer and adjoin a junction between the first and second semiconductor layer.

In a second embodiment, the semiconductor volume has a first, second, third and fourth semiconductor layer arranged in this order on the cathode. In this case, the first semiconductor layer is $n^+$-doped, the second semiconductor layer is n-doped, the third semiconductor layer is $n^-$-doped and the fourth semiconductor layer is p-doped. The semiconductor zones are formed as p-doped zones within the second semiconductor layer and adjoin a junction between the first and second semiconductor layer. The difference from the previously described embodiment thus consists in the fact that, in the second embodiment, the semiconductor zones are at least partly surrounded by an additional, n-doped semiconductor layer.

The semiconductor zones are preferably configured in insular fashion (rectangular, round or other arbitrary shapes) and are advantageously arranged equidistantly from one another in order to obtain a regular electric field strength structure. In this case, the thickness of the semiconductor zones should lie in a range of 3 to 20 μm, the width should lie in a range of 2 to 200 μm and the distance between the semiconductor zones should lie in a range of 5 to 200 μm. The semiconductor zones are preferably configured identically in their dimensions. However, the invention is not restricted to these ranges of values.

The rule of thumb that 1/10 of the reverse voltage of a semiconductor diode (calculated in volts) should correspond to the thickness of the semiconductor diode (calculated in μm) generally holds true. In the first embodiment described, in which the semiconductor volume comprises three semiconductor layers, the distance between the semiconductor zones and the third semiconductor layer is thus analogously preferably greater than 200 μm by way of example for a component having a reverse voltage of >2 kV. In the second embodiment, in which the semiconductor volume comprises four semiconductor layers, the distance between the semiconductor zones and the fourth semiconductor layer is analogously preferably greater than 200 μm. Furthermore, in the second embodiment, the distance between the semiconductor zones and the junction between the second and third semiconductor layer is between 10 μm and 25 μm. The thickness of the semiconductor zones should lie in a range of 0.2 μm to 20 μm. The invention is not restricted to the ranges specified above.

The IGBT according to the invention has a front side contact, a rear side contact and a semiconductor volume provided between front side contact and rear side contact. A field stop layer for spatially delimiting an electric field that can be formed in the semiconductor volume is provided in the semiconductor volume, a plurality of semiconductor zones being formed in the field stop layer, which semiconductor zones are inversely doped with respect to their immediate surroundings and are spaced apart from one another.

In a first preferred embodiment, the semiconductor volume has a first, second and third semiconductor layer arranged in this order on the rear side contact, the first semiconductor layer being a p-doped emitter layer, the second semiconductor layer being an n-doped field stop layer, and the third semiconductor layer being an n$^-$-doped base region. In this embodiment, the semiconductor zones are formed as p-doped zones within the n-doped field stop layer.

In a second preferred embodiment, the semiconductor volume has a first, second, third and fourth semiconductor layer arranged in this order on the rear side contact, the first semiconductor layer being a p-doped emitter layer, the second semiconductor layer being an n-doped part of the field stop layer, the third semiconductor layer being a weakly n-doped part of the field stop layer, and the fourth semiconductor layer being an n$^-$-doped base region. In this embodiment, the p-doped semiconductor zones are formed in the weakly n-doped part of the field stop layer and adjoin a junction between the second semiconductor layer and the third semiconductor layer. Accordingly, the difference between this embodiment and the previously described embodiment is that, in this embodiment, the semiconductor volume has an additional weakly n-doped layer that at least partly surrounds the semiconductor zones.

Usually, p-doped body regions are incorporated into the upper end of the third semiconductor layer (first embodiment) or into the upper end of the fourth semiconductor layer (second embodiment). Since the rule of thumb that 1/10 of the reverse voltage of an IGBT (calculated in volts) should correspond to the thickness of the IGBT (calculated in μm) analogously holds true in this case, too, the distance between the semiconductor zones and the p-doped body regions in both cases is preferably more than 200 μm by way of example for a component having a reverse voltage of >2 kV. In the second embodiment, the distance between the semiconductor zones and the junction between the third and fourth semiconductor layer should furthermore lie in a range of 10 μm to 25 μm. The application of the rule of thumb described is not absolutely necessary; a different functional relationship may also exist.

The thickness of the semiconductor zones preferably lies in a range of 0.2 μm to 20 μm, the width of the semiconductor zones preferably lies in a range of 2 μm to 200 μm, and the distance between the semiconductor zones lies in a range of 5 to 200 μm.

All of the ranges of values described are merely preferred embodiments and do not constitute any restriction of the invention. All of the embodiments described in the application text can be doped inversely, that is to say that n-type regions and p-type regions can be interchanged with one another.

BRIEF DESCRIPTION OF THE DRAWINGS

The invention is explained in more detail below in exemplary embodiments with reference to the figures, in which.

In the figures, identical or mutually corresponding components or groups of components are identified by the same reference numerals.

DETAILED DESCRIPTION

Figure 1:
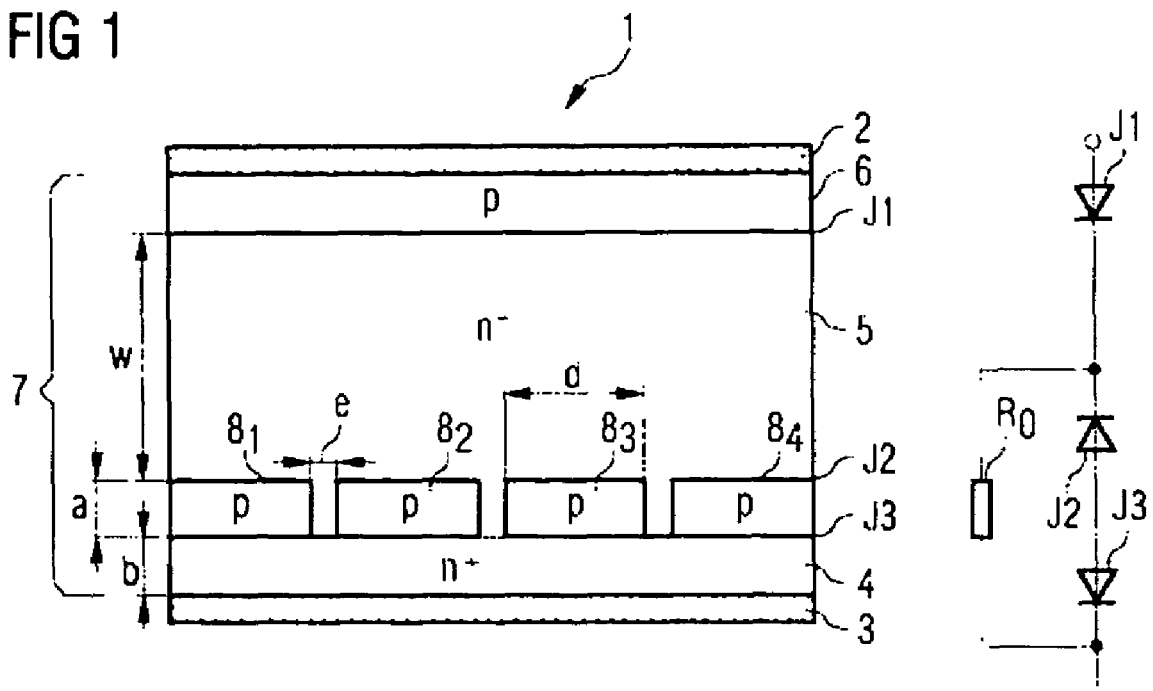
FIG. 1 shows a first preferred embodiment of a semiconductor diode according to the invention together with the associated equivalent circuit diagram.

FIG. 1 shows a first embodiment 1 of a semiconductor diode according to the invention. The semiconductor diode 1 has an anode 2, a cathode 3, a first semiconductor layer 4, a second semiconductor layer 5 and a third semiconductor layer 6, the first semiconductor layer 4 being n$^+$-doped, the second semiconductor layer 5 being n$^-$-doped and the third semiconductor layer 6 being p-doped. The first, second and third semiconductor layers 4, 5 and 6 together form a semiconductor volume 7 provided between the anode 2 and the cathode 3. A plurality of semiconductor zones $8_1$ to $8_4$ are provided within the second semiconductor layer 5 and, in this embodiment, have a rectangular cross section and are spaced apart equidistantly from one another. The semiconductor zones $8_1$ to $8_4$ are arranged at the same vertical height, their respective undersides directly adjoining the first semiconductor layer 4.

In this embodiment, the thickness b of the first semiconductor layer 4 is 0.2 to 30 µm, the thickness a of the semiconductor zones $8_1$ to $8_4$ is 3 to 20 µm, and the distance w between the semiconductor zones $8_1$ to $8_4$ and the third semiconductor layer 6 is more than 200 µm. The width d of the semiconductor zones $8_1$ to $8_4$ is in each case 2 to 200 µm, and the distance e between the semiconductor zones $8_1$ to $8_4$ is 5 to 200 µm. The doping of the semiconductor zones $8_1$ to $8_4$ is at most 1E15 to 5E16 $cm^{-3}$. The semiconductor diode 1 is designed for voltages of >2000 V to 8000 V. The invention is not restricted to these ranges of values. The abovementioned values depend, as has already been mentioned, on the desired voltage class of the semiconductor device ("rule of thumb formula") and are therefore not to be understood as a restriction but merely as an example.

The junction between the first semiconductor layer 4 and the semiconductor zones $8_1$ to $8_4$ is designated by J3, the junction between the semiconductor zones $8_1$ to $8_4$ and the second semiconductor layer 5 is designated by J2, and the junction between the second and third semiconductor layer 5, 6 is designated by J1.

The functioning of the semiconductor diode 1 according to the invention is explained in more detail below.

When the semiconductor diode commutates into the off state, J2 is forward-biased and J1 and J3 are reverse-biased. J1 is designed for 2000 to 8000 V. J3 is designed for 10 to 100 V. If a dynamic "avalanche" arises at the main junction J1, then J3 is likewise in the avalanche state.

During this state, the charge carrier peak is still situated in the central zone of the diode. J3 then injects holes into the charge carrier peak. This prevents the charge carrier peak from coming away from the junction J3. The injected holes compensate for the electrons coming from the junction J1 as a result of the dynamic avalanche. Consequently, it is not possible for a space charge zone carried by the free electrons to build up between charge carrier peak and $n^+$-type zone (first semiconductor layer 4).

The p-type zone formed by the semiconductor zones $8_1$-$8_4$ is interrupted, which is represented by the resistance R in the equivalent circuit diagram. In the case of a continuous p-type zone, the junction J2 would effect blocking if the diode were operated in the forward direction. The resistance R provides a shunt for small currents in the forward direction. At typical operating currents, the pnpn structure is activated, i.e. turned on, and flooded with charge carriers. R should not be too low: in the event of commutation, a voltage that leads to an avalanche must be built up at the junction J3.

According to the invention, then, a dynamic avalanche arises at a pn junction on the cathode side, which leads to the stabilization of the electric field. The "soft recovery behavior" also additionally improves, due to the charge carrier peak sticking to the cathode side of the diode.

If the space charge zone reaches the upstream p-type zones when the static reverse voltage is applied, then an increased reverse current arises through the open base npn transistor. However, the blocking capability is not lost. An experiment found a step in the reverse current that corresponds to reaching the p-type region. The reverse current rose from >100 µA to 1 µA to 1 mA to 5 mA at 25° C.

Figure 2:
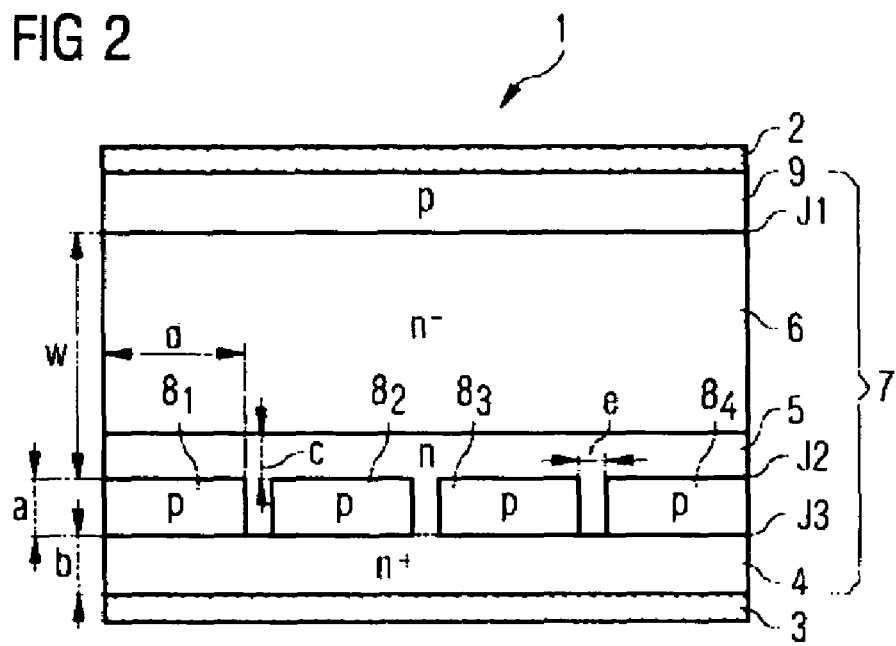
FIG. 2 shows a second preferred embodiment of a semiconductor diode according to the invention.

FIG. 2 shows a second embodiment 1' of a semiconductor diode according to the invention. The semiconductor diode 1' has an anode 2, a cathode 3, a first semiconductor layer 4, a second semiconductor layer 5', a third semiconductor layer 6' and a fourth semiconductor layer 9, the first semiconductor layer 4 being $n^+$-doped, the second semiconductor layer 5' being n-doped, the third semiconductor layer 6' being $n^-$-doped and the fourth semiconductor layer 9 being p-doped. Thus, compared with the embodiment 1 shown in FIG. 1, an additional semiconductor layer 5' is provided which is n-doped and at least partly surrounds the semiconductor zones $8_1$ to $8_4$. The doping of the second semiconductor layer 5' serving as a buffer for the extent of the space charge zone lies between 5E14 and 5E15 $cm^{-3}$, and the distance c between the top sides of the semiconductor zones $8_1$ to $8_4$ and the junction between the second semiconductor layer 5' and the third semiconductor layer 6' is between 10 and 25 µm. By virtue of adding the second semiconductor layer 5', the step in the reverse current profile can be shifted toward higher voltages. The remaining ranges of values correspond to those of the first embodiment. The invention is not restricted to these ranges of values.

The buffer (the second semiconductor layer 5') additionally reduces the blocking capability of the junction J2; the turn-on of the diode is facilitated.

Given suitable dimensioning of the proportion of the areas of the semiconductor zones $8_1$-$8_4$ (p-type area), the size of the individual semiconductor zones $8_1$-$8_4$ (p-type islands) and their distances from one another and from the cathode, the flooding of the component with charge carriers can also be modulated locally differently: the greater the proportion of p-type area, the lower the charge carrier density of the flooding charge in the upstream $n^-$-type region. As a result, the forward voltage and switching losses can be reduced in a targeted manner.

According to the invention, the p-type islands integrated into the n-type emitters do not reach as far as the cathode metallization. Such a configuration would lead to a very late and abrupt commencement of the injection of holes. It would not be possible to dimension the doping regions so as equally to bring about a soft switching behavior and to prevent high field strengths at the $nn^+$ junction. The required dynamic properties with regard to the different bias current densities and intermediate circuit voltages that occur during practical operation could not be fulfilled, either because the diode no longer has a sufficient blocking capability at small current densities and/or high voltages, or holes are no longer injected at high current densities and/or low voltages.

Thus, an essential aspect of the invention is, in the case of a high-voltage diode structure, improving the commutation strength by means of stabilizing dynamic avalanche at the cathode during switching. The semiconductor diode embodiments 1, 1' according to the invention make it possible to avoid destructive electric fields at an $nn^+$ junction without the semiconductor diode having to have such a large central zone thickness that a dynamic "avalanche" at the pn junction of the semiconductor diode is ended before an electric field can form at the $nn^+$ junction.

Figure 3:
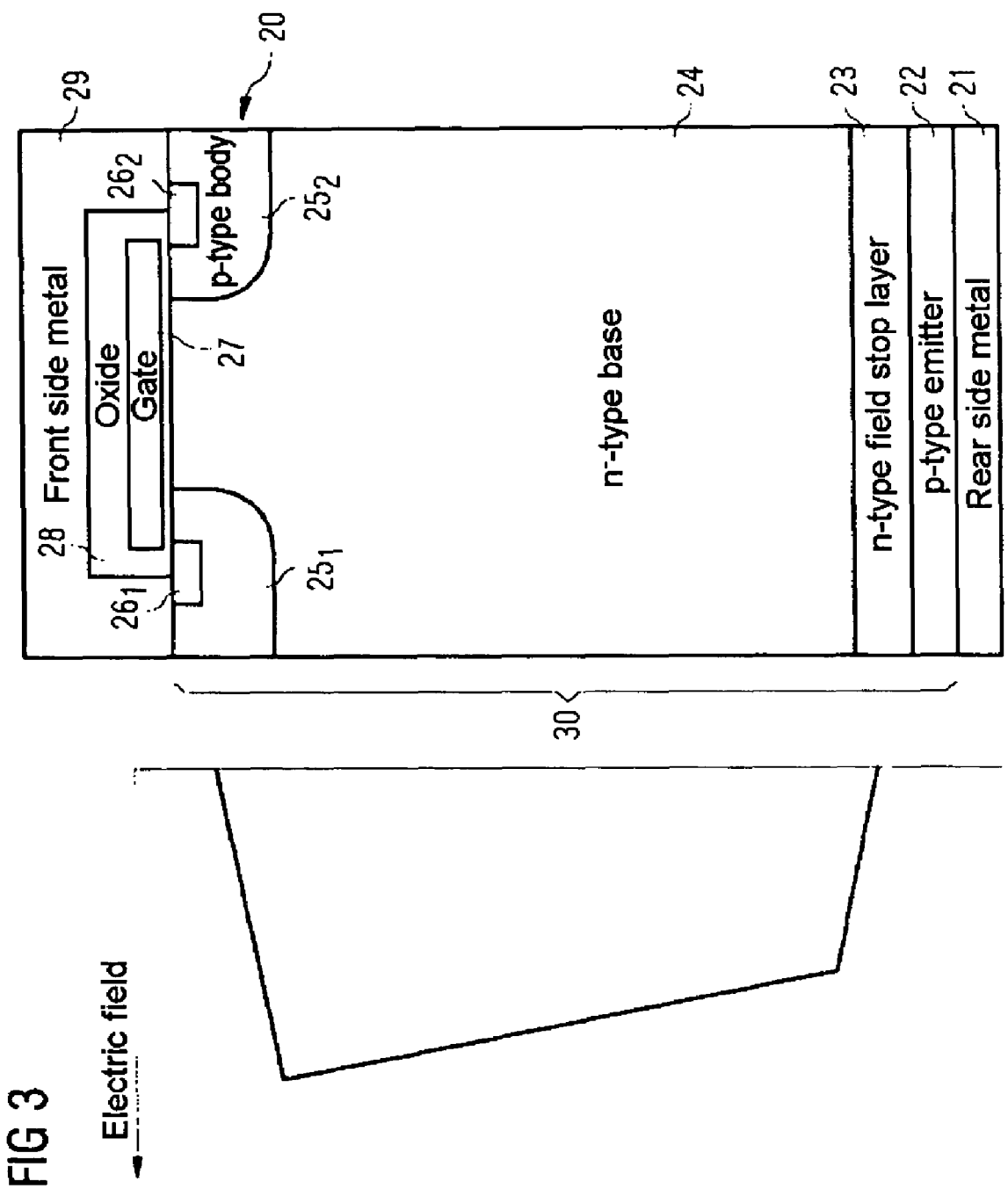
FIG. 3 shows an embodiment of a conventional IGBT with the associated vertical electric field distribution.

FIG. 3 shows a conventional embodiment 20 of an IGBT according to the invention. This embodiment has a rear side contact 21 and a front side contact 29, between which a semiconductor volume 30 is provided. The semiconductor volume 30 has a first semiconductor layer 22, a second semiconductor layer 23 and a third semiconductor layer 24. In this case, the first semiconductor layer 22 is a p-type emitter layer, the second semiconductor layer 23 is an n-type field stop layer, and the third semiconductor layer 24 is an $n^-$-type base region. A first and a second p-doped body region $25_1$ and $25_2$ are incorporated into the third semiconductor layer 24, an n-doped source region $26_1$, $26_2$ respectively being introduced in turn into said body regions. A gate 27 is furthermore provided, which is insulated from the third semiconductor layer 24 and the front side contact 29 by means of an oxide layer 28 that electrically insulates the gate 27 from the source potential. FIG. 3 additionally shows the strength of an electric field that can be formed within the semiconductor volume 30. The functioning of an IGBT of this type is known and will not be explained here.

Figure 4:
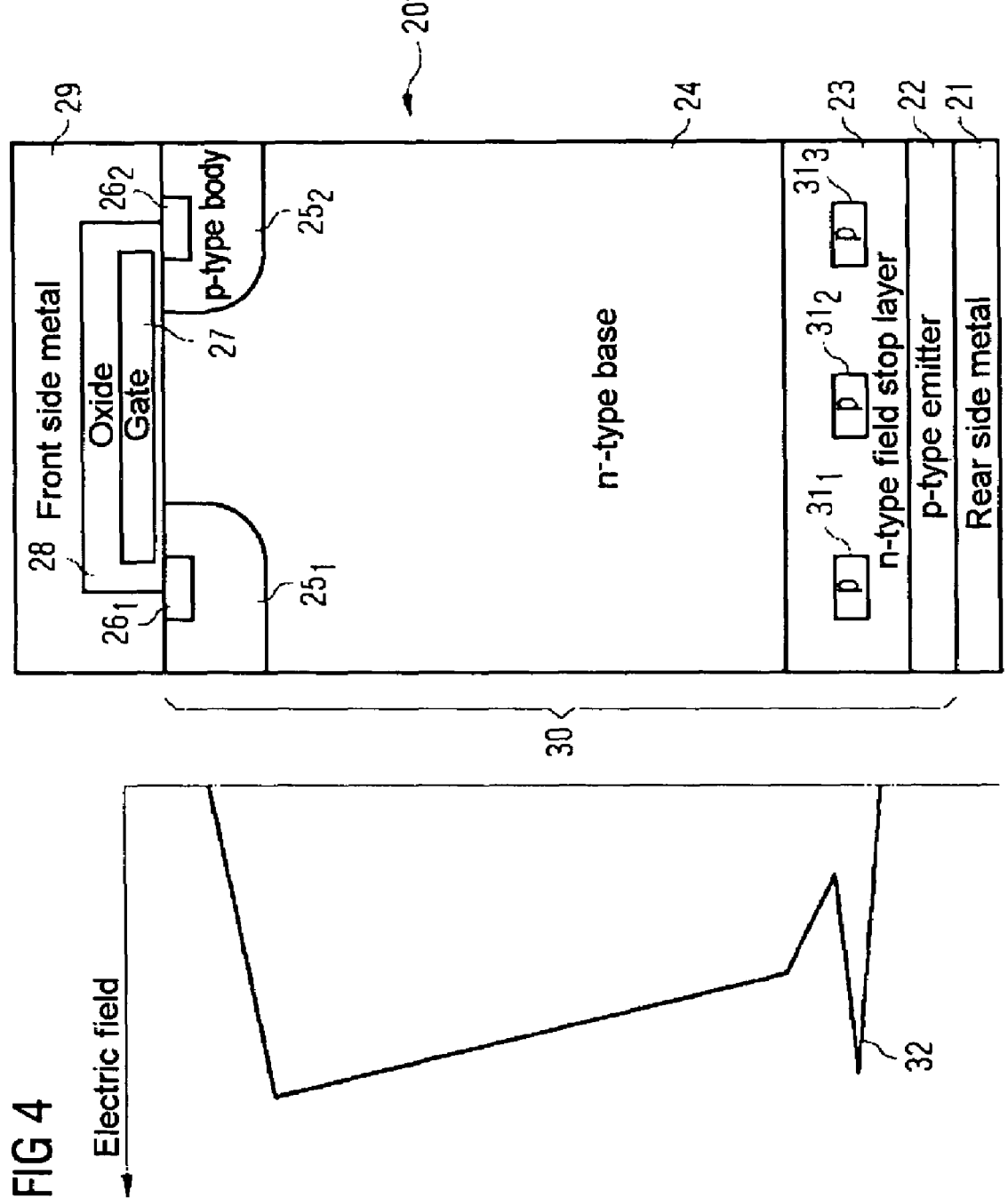
FIG. 4 shows a preferred embodiment of an IGBT according to the invention with the associated vertical electric field distribution. In this case, the section runs through one of the p-type islands.

The embodiment 20' of an IGBT according to the invention as shown in FIG. 4 differs from the embodiment shown in FIG. 3 merely by the fact that p-doped semiconductor zones $31_1$ to $31_3$ are formed in the second semiconductor layer 23, i.e. in the n-doped field stop layer.

FIG. 4 furthermore shows the vertical field strength profile that forms within the semiconductor volume 30. The section runs through one of the p-type islands. It can clearly be seen that, through the semiconductor zones $31_1$ to $31_3$, a field spike 32 is generated within the electric field strength profile, said field spike leading to a desired avalanchelike generation of charge carriers. The field strength profile of the electric field as shown in FIG. 4 occurs during turn-off processes or in the case of short circuits.

Figure 5:
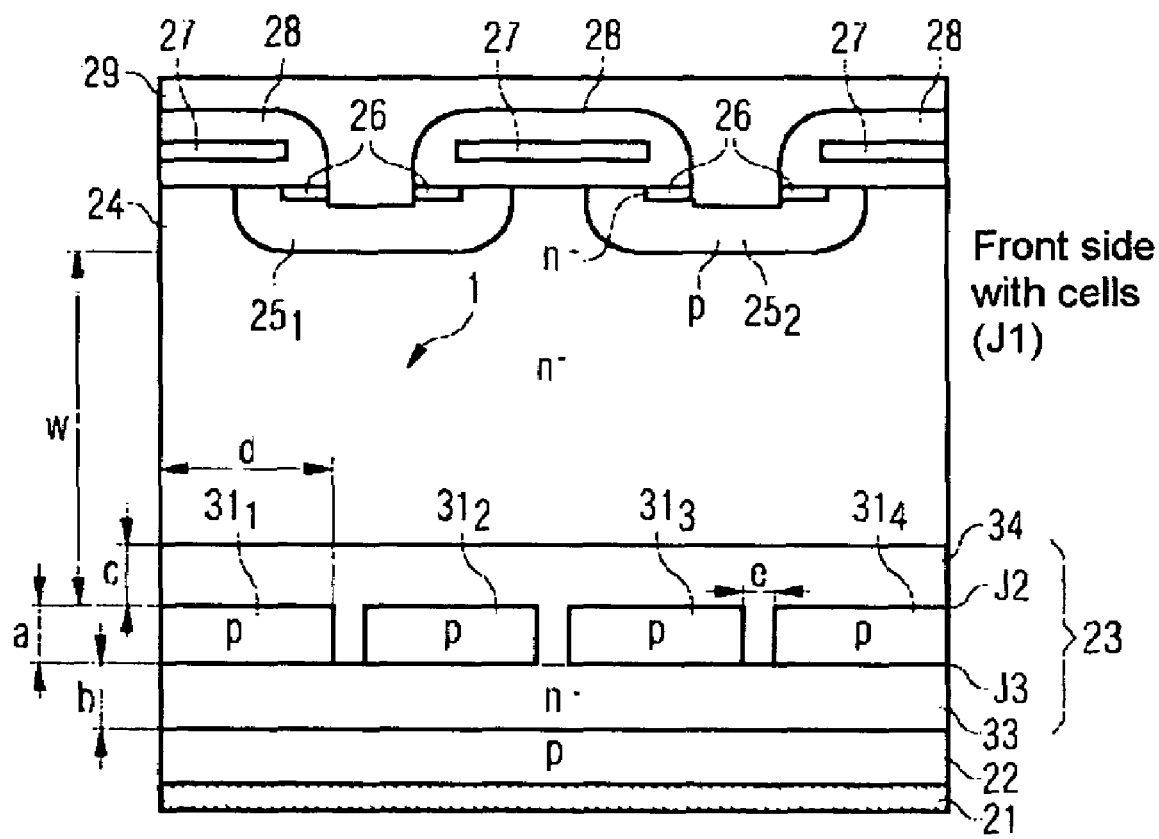
FIG. 5 shows a preferred embodiment of a section of the IGBT according to the invention which is shown in FIG. 4.

FIG. 5 illustrates a schematic illustration of a preferred embodiment of the IGBT 20' according to the invention as shown in FIG. 4. In the embodiment shown in FIG. 5, the second semiconductor layer 23 is split into a first n-doped part 33 and a second weakly doped part 34. The semiconductor zones $31_1$ to $31_4$ are formed within the second part 34 of the field stop layer 23, their undersides adjoining a junction between the first part 33 and the second part 34 of the field stop layer 23. The cell array at the front side may also be embodied differently, of course, for example with field plate trenches.

The doping of the p-doped semiconductor zones $31_1$ to $31_4$ is at most 1E15 to 1E18 $cm^{-3}$, preferably 1E16 to 5E16 $cm^{-3}$. The distance w between the p-doped body regions $25_1$ and $25_4$ and the p-doped semiconductor zones $31_1$ and $31_3$ depends on the desired blocking capability and is preferably more than 200 μm in this example, the distance c between the semiconductor zones $31_1$ and $31_4$ and the junction between the second and third semiconductor layer 23, 24 is preferably 10 μm to 25 μm, the thickness a of the semiconductor zones $31_1$ and $31_4$ is preferably 0.5 to 20 μm, the width d thereof is preferably 2 to 200 μm, and the distance e between the semiconductor zones $31_1$ and $31_3$ is preferably 5 to 200 μm. However, the invention is not restricted to these ranges.

Further aspects of the IGBT 20' according to the invention will be discussed in the description below.

A very effective method of inducing a targeted injection of holes into the base zone of the IGBT during the turn-off process or during a short circuit consists in integrating p-doped islands into the field stop zone. The intensity of the hole injection and also the temporal profile thereof may in this case be controlled by way of the design of said islands, that is to say e.g. by way of the width in the lateral direction and also by way of their doping concentration. In this case, the injection should be chosen, on the one hand, to be high enough that the desired turn-off softness results especially under hard switching conditions, but on the other hand should also not be too high in order to keep the turn-off losses under normal switching conditions as low as possible. In particular, the p-doped islands must not have contact with the rear side metallization or with the rear side p-type emitter, but rather must be isolated therefrom by an n-type region.

The schematic cross section of such a structure (rear side p-type emitter and precise illustration of the cells on the front side not illustrated) is shown in FIG. 5. The p-doped layers buried in the field stop zone may be realized e.g. by means of a high-energy ion implantation or else by means of the application of wafer bonding techniques or epitaxy. The doping of the p-doped islands is a maximum of between 1E15 and 1E18 $cm^{-3}$, preferably between 1E16 and 5E16 $cm^{-3}$. A complete IGBT structure in accordance with the invention is illustrated in FIG. 4 and FIG. 5. Naturally, the planar cell structure on the front side may also be replaced by a trench cell structure.

The hole injection caused by the p-type islands is caused by virtue of the fact that a voltage that exceeds the reverse voltage of the pn junction J3 occurs between the p-type island and the adjoining n-type doping during turn-off or in the event of a short circuit. The current generated as a result of the avalanche is injected as hole current and serves for softer turn-off or stabilization of the electric field in the event of a short circuit.

The introduction of a field stop layer with increased n-type doping results in a further degree of freedom for determining the voltage from which the p-type islands are actually able to inject. As a result, in the case of low intermediate circuit voltages or applications with a low leakage inductance and correspondingly low overvoltage spikes during switching, the injection and the associated increase in the turn-off losses can be avoided.

Consequently, an essential aspect of the invention is generating an additional current by means of avalanche under critical operating conditions, which is injected as hole current and leads to softer turn-off or stabilization of the electric field in the event of a short circuit.

The p-type islands may be cross-sectionally polygonal or circular or else be designed as strips. The p-type islands may be introduced such that they are aligned or not aligned with respect to the front side. The grid of the p-type islands may be in a simple integral ratio to the grid of the front side structure (grid of the cells of the cell array), that is to say one, two, ..., p-type islands per cell.

The n-type doping introduced into the n-type field stop zones upstream of the p-type islands (between p-type islands and n⁻-type region) has a dose of between $2E11/cm^2$ and $2E12/cm^2$ and, in order to be able to set this dose as precisely as possible, may be introduced by means of implantation in combination with one or more subsequent indiffusion steps.

The invention claimed is:

1. A semiconductor diode comprising:
   an anode,
   a cathode,
   a semiconductor structure disposed between the anode and the cathode, the semiconductor structure including first, second, third and fourth semiconductor layers arranged in sequence from the cathode to the anode, the first semiconductor layer being n⁺-doped, the second semiconductor layer being n-doped, the third semiconductor layer being n⁻-doped and the fourth semiconductor layer being p-doped, the semiconductor structure further comprising a plurality of spaced apart semiconductor zones, each of the plurality of semiconductor zones being inversely doped with respect to the immediate surroundings thereof, each of the semiconductor zones proximate to and spaced apart from the cathode, wherein the third semiconductor layer is configured to include a flooding charge, and separate junctions are formed between the third and fourth semiconductor layers and between the second and third semiconductor layers, respectively, and
   wherein a distance between the semiconductor zones and the junction between the second and the third semiconductor layers is smaller than a distance between the fourth semiconductor layer and the second semiconductor layer, wherein the semiconductor zones are located only in the second semiconductor layer.

2. The semiconductor diode as claimed in claim 1, wherein the semiconductor zones comprise p-doped zones disposed within the second semiconductor layer.

3. The semiconductor diode as claimed in claim 1, wherein the semiconductor zones adjoin a junction between the first and second semiconductor layer.

4. The semiconductor diode as claimed in claim 1, wherein a distance between the semiconductor zones and the fourth semiconductor layer is greater than 200 µm.

5. The semiconductor diode as claimed in claim 1, wherein a distance between the semiconductor zones and a junction between the second and third semiconductor layers is approximately between 10 µm and 25 µm.

6. The semiconductor diode as claimed in claim 1, wherein a thickness of the semiconductor zones is approximately between 3 µm and 20 µm.

7. The semiconductor diode as claimed in claim 3, wherein a thickness of the first semiconductor layer is approximately between 0.2 µm and 12 µm.

8. A semiconductor diode comprising:
an anode,
a cathode,
a semiconductor structure disposed between the anode and the cathode, the semiconductor structure including first, second, third and fourth semiconductor layers arranged in sequence from the cathode to the anode, the first semiconductor layer being $n^+$-doped, the second semiconductor layer being n-doped, the third semiconductor layer being $n^-$-doped and the fourth semiconductor layer being p-doped, the semiconductor structure further comprising a plurality of spaced apart semiconductor zones, each of the plurality of semiconductor zones being p-doped, embedded within the second semiconductor layer adjoining a junction between the first and second semiconductor layer and spaced apart from the cathode, wherein the third semiconductor layer is configured to include a flooding charge, and separate junctions are formed between the third and fourth semiconductor layers and between the second and third semiconductor layers, respectively, and wherein a distance between the semiconductor zones and the junction between the second and the third semiconductor layer is smaller than a distance between the fourth semiconductor layer and the second semiconductor layer, wherein the semiconductor zones are located only in the second semiconductor layer.

9. The semiconductor diode as claimed in claim 8, wherein a distance between the semiconductor zones and the fourth semiconductor layer is greater than 200 µm.

10. The semiconductor diode as claimed in claim 8, wherein a distance between the semiconductor zones and a junction between the second and third semiconductor layers is approximately between 10 µm and 25 µm.

11. The semiconductor diode as claimed in claim 8, wherein a thickness of the semiconductor zones is approximately between 3 µm and 20 µm.

12. The semiconductor diode as claimed in claim 8, wherein a thickness of the first semiconductor layer is approximately between 0.2 µm and 12 µm.

13. The semiconductor diode as claimed in claim 8, wherein a distance between adjacent semiconductor zones is approximately between 5 µm and 200 µm.

* * * * *